United States Patent
Duan et al.

(10) Patent No.: US 11,349,445 B2
(45) Date of Patent: May 31, 2022

(54) COMPENSATION OF COMMON MODE VOLTAGE DROP OF SENSING AMPLIFIER OUTPUT DUE TO DECISION FEEDBACK EQUALIZER (DFE) TAPS

(71) Applicant: QUALCOMM Incorporated, San Diego, CA (US)

(72) Inventors: Ying Duan, San Diego, CA (US); Jing Wu, San Diego, CA (US); Zhi Zhu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 124 days.

(21) Appl. No.: 17/017,239

(22) Filed: Sep. 10, 2020

(65) Prior Publication Data

US 2022/0077830 A1 Mar. 10, 2022

(51) Int. Cl.
*H03K 3/037* (2006.01)
*H03F 3/45* (2006.01)
(Continued)

(52) U.S. Cl.
CPC ......... *H03F 3/45269* (2013.01); *H03K 3/037* (2013.01); *H03K 5/24* (2013.01);
(Continued)

(58) Field of Classification Search
CPC .... H03F 3/45269; H03F 3/26; H03F 3/45479; H03K 3/037; H03K 5/24;
(Continued)

(56) References Cited

U.S. PATENT DOCUMENTS 8,391,350 B2 * 3/2013 Chan .................. H04L 25/03057
375/232
8,831,084 B1 9/2014 Liu et al.
(Continued)

OTHER PUBLICATIONS

Kaviani K., et al., "A 0.4-mW/Gb/s Near-Ground Receiver Front-End With Replica Transconductance Termination Calibration for a 16-Gb/s Source-Series Terminated Transceiver," IEEE Journal of Solid-State Circuits, IEEE, USA, vol. 48, No. 3, Mar. 1, 2013 (Mar. 1, 2013), pp. 636-648, XP011494575, ISSN: 0018-9200, DOI: 10.1109/JSSC.2013.2242714, figures 5.7 Section II, abstract.
(Continued)

*Primary Examiner* — Vineeta S Panwalkar
(74) *Attorney, Agent, or Firm* — Loza & Loza, LLP

(57) ABSTRACT

A receiver including a first differential sense amplifier configured to amplify an input differential data signal to generate an output differential data signal; a first set of one or more differential decision feedback equalizer (DFE) taps configured to modify the output differential data signal based on a set of one or more differential tap signals, wherein the first set of one or more differential DFE taps affect an output common mode voltage associated with the output differential data signal; and a compensation circuit configured to adjusts the output common mode voltage to compensate for the effect on the output common mode voltage by the set of one or more differential DFE taps. The compensation circuit includes reference and replica receivers to generate reference and replica output common mode voltages, and a feedback circuit to adjust the output common mode voltage based on the reference and replica output common mode voltages.

27 Claims, 5 Drawing Sheets

(51) Int. Cl.
*H03K 5/24* (2006.01)
*H04L 25/03* (2006.01)
*H03K 5/00* (2006.01)

(52) U.S. Cl.
CPC ............... *H04L 25/03057* (2013.01); *H03K 2005/00013* (2013.01)

(58) Field of Classification Search
CPC .... H03K 2005/00013; H04L 25/03057; H04L 25/0272; H04L 25/0276; H04L 25/03114; H04L 25/03878; H04L 25/03885; H04L 25/0292; G06F 13/00
See application file for complete search history.

(56) References Cited

U.S. PATENT DOCUMENTS

| | | | |
|---|---|---|---|
| 9,240,912 | B1 | 1/2016 | Giridharan et al. |
| 9,564,863 | B1 | 2/2017 | Giridharan |
| 11,233,482 | B2* | 1/2022 | Al-Shyoukh ......... H03F 1/0288 |

OTHER PUBLICATIONS

Lin X., et al., "A CMOS 0.25-tex$muhboxm$/texContinuous-Time FIR Filter With 125 ps per Tap Delay as a Fractionally Spaced Receiver Equalizer for 1-Gb/s Data Transmission," IEEE Journal of Solid-State Circuits, IEEE, USA vol. 40, No. 3, Mar. 1, 2005 (Mar. 1, 2005), pp. 593-602, XP011128263, ISSN: 0018-9200, DOI: 10.1109/JSSC.2005.843623, figures 1.2.13, Section II. A, Section II.E.

Partial International Search Report—PCT/US2021/047115—ISA/EPO—dated Dec. 13, 2021.

International Search Report and Writtenn Opinion—PCT/US2021/047115—ISA/EPO—dated Mar. 18, 2022.

Sobel D.A., et al., "A 1 Gb/s Mixed-Signal Baseband Analog Front-End for a 60 GHz Wireless Receiver", IEEE Journal of Solid-State Circuits, IEEE, USA, vol. 44, No. 4, Apr. 1, 2009 (Apr. 1, 2009), pp. 1281-1289, XP011254307, ISSN: 0018-9200, DOI: 10.1109/JSSC.2009.2014731, figures 4,7-9, Sections III.B, III.C.

\* cited by examiner

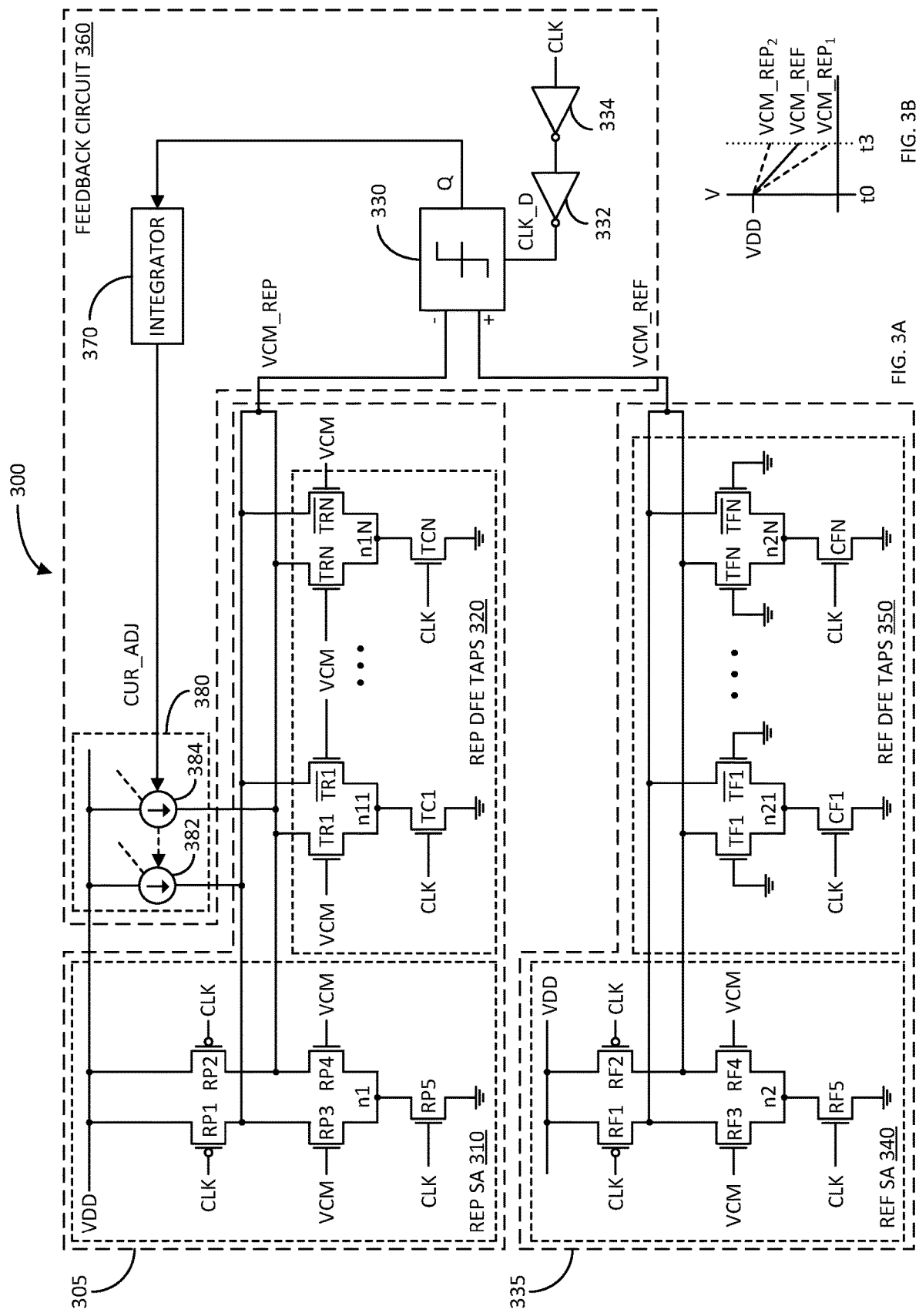

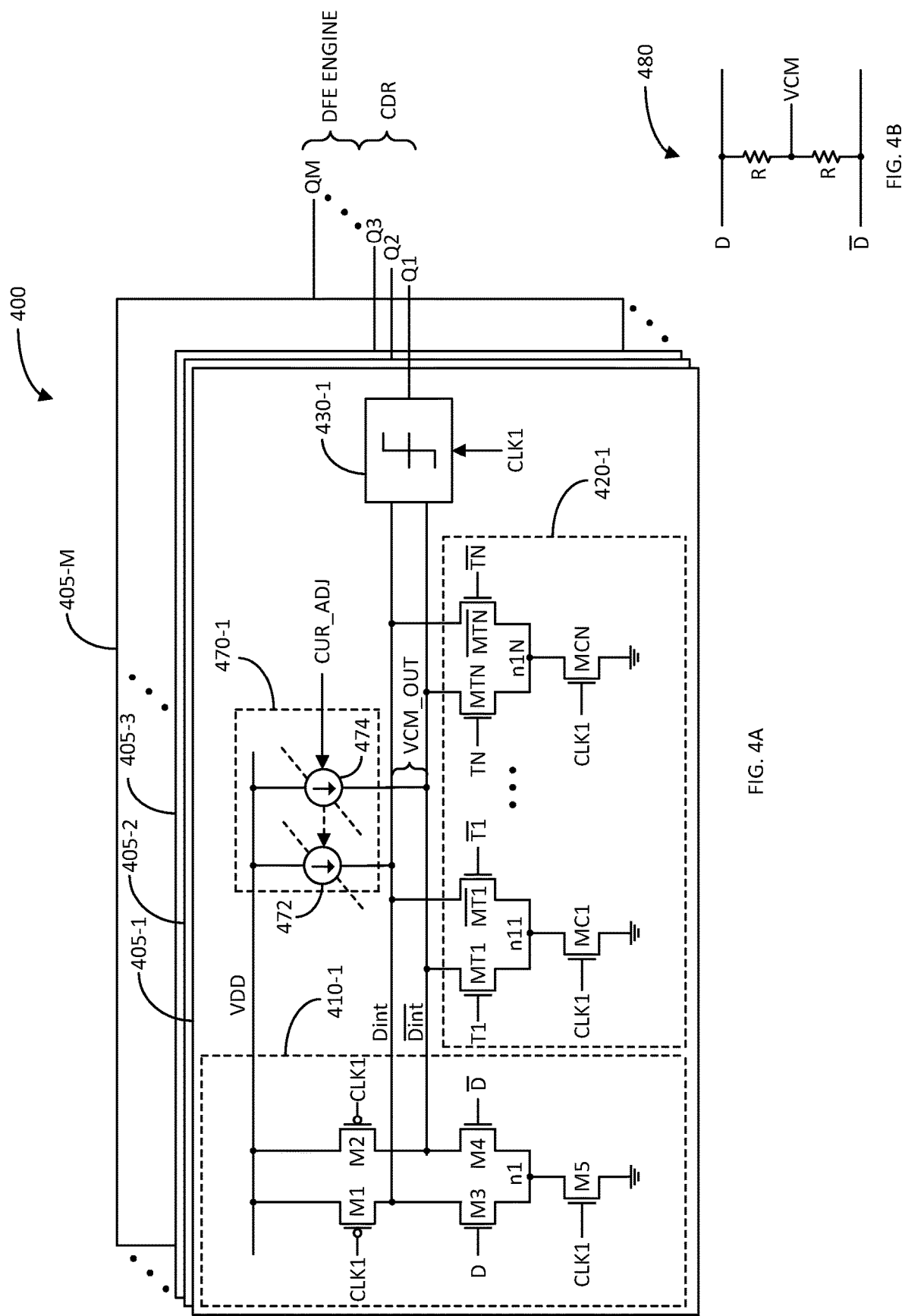

COMPENSATION OF COMMON MODE VOLTAGE DROP OF SENSING AMPLIFIER OUTPUT DUE TO DECISION FEEDBACK EQUALIZER (DFE) TAPS

FIELD

Aspects of the present disclosure relate generally to differential data signal receivers, and in particular, to the compensation of the output common mode voltage drop of a sensing amplifier due to decision feedback equalizer (DFE) taps coupled to the differential output of the sensing amplifier.

DESCRIPTION OF RELATED ART

A transmitter may transmit a differential signal to a receiver via a differential transmission line, which may take the form of two metallization traces formed on a printed circuit board (PCB). The differential transmission line may be modelled as series resistors representing the metallization traces, respectively, and a shunt capacitor coupled between the series resistors. As such, the differential transmission line has a low pass filter (LPF) type frequency response. The LPF response of the differential transmission line significantly removes high frequency components from the transmit differential signal, which may causer inter-symbol interference at the receiver. Through a decision feedback equalizer (DFE), the receiver is able to enhance the received signal to reduce inter-symbol interference.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus including a first receiver including a first differential input to receive a differential data signal and a first differential output; a second receiver including a second differential input to receive a common mode voltage associated with the differential data signal, and a second differential output including terminals coupled together; a third receiver including a third differential input to receive the common mode voltage, and a third differential output including terminals coupled together; and a feedback circuit including inputs coupled to the second and third differential outputs, respectively, and an output coupled to the first and second differential outputs.

Another aspect of the disclosure relates to an apparatus. The apparatus including a first differential sense amplifier configured to amplify an input differential data signal to generate an output differential data signal; a first set of one or more differential decision feedback equalizer (DFE) taps configured to modify the output differential data signal based on a set of one or more differential tap signals, wherein the first set of one or more differential DFE taps affect a first output common mode voltage associated with the output differential data signal; and a compensation circuit configured to adjusts the first output common mode voltage to compensate for the effect on the output common mode voltage by the first set of one or more differential DFE taps.

Another aspect of the disclosure relates to a method. The method includes amplifying an input differential data signal to generate an output differential data signal; modifying the output differential data signal based on a set of one or more differential decision feedback equalizer (DFE) tap signals, said modifying the output differential data signal affects a first output common mode voltage associated with the output differential signal; and adjusting the first output common mode voltage to compensate for the effect on the first output common mode voltage due to the modifying of the output differential data signal based on the set of differential DFE tap signals.

Another aspect of the disclosure relates to a wireless communication device. The wireless communication device includes at least one antenna; a transceiver coupled to the at least one antenna; and a first receiver including a first differential input coupled to the transceiver, and a first differential output; a second receiver including a second differential input to receive a common mode voltage associated with a differential data signal at the first differential input, and a second differential output including terminals coupled together; a third receiver including a third differential input to receive the common mode voltage, and a third differential output including terminals coupled together; and a feedback circuit including inputs coupled to the second and third differential outputs, respectively, and an output coupled to the first and second differential outputs.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 3A illustrates a schematic diagram of an example output common mode voltage compensation circuit in accordance with another aspect of the disclosure.

FIG. 3B illustrates a graph of example replica and reference output common mode voltages of the compensation circuit of FIG. 3A in accordance with another aspect of the disclosure.

FIG. 4A illustrates a schematic/block diagram of another example differential data signal receiver in accordance with another aspect of the disclosure.

FIG. 4B illustrates a schematic diagram of an example input common mode voltage source in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
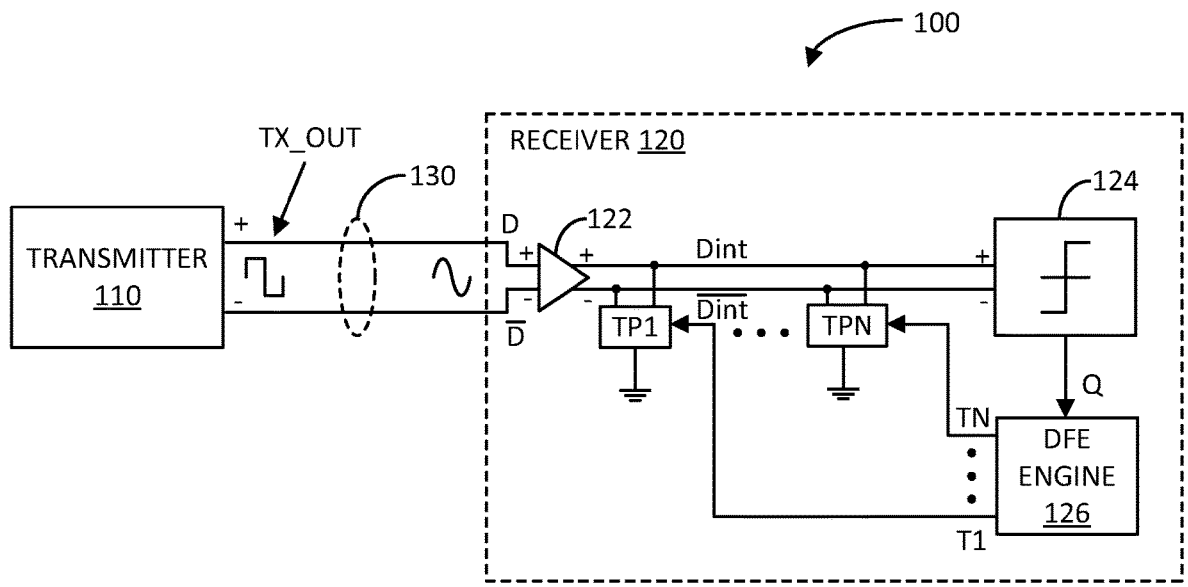
FIG. 1A illustrates a block diagram of an example data communication system in accordance with an aspect of the disclosure.

FIG. 1A illustrates a block diagram of an example data communication system 100 in accordance with an aspect of the disclosure. The data communication system 100 includes a transmitter 110, a receiver 120, and a differential transmission line 130 coupled between the transmitter 110 and the receiver 120.

The transmitter 110 is configured to generate a differential transmit signal at a differential output +/− coupled to a differential input of the differential transmission line 130. The differential transmission line 130 includes a differential output coupled to a differential input +/− of the receiver 120. As illustrated, the differential transmit signal may be substantially square wave, as it is rich in high frequency components to generate that waveform. However, the differential transmission line 130, which may be configured as metallization traces on a printed circuit board (PCB), twisted wire pairs, coaxial, and others, includes parasitic series resistance and shunt capacitance that operate essentially as a low pass filter (LPF) to reduce the high frequency components of the differential transmit signal to produce a more sinusoidal waveform differential signal at the differential input of the receiver 120.

It is generally more difficult to extract data from a differential signal whose waveform is more sinusoidal than a signal having a waveform that is square wave. Accordingly, the receiver 120 includes circuitry to improve the shape of the waveform of the received differential signal so that data can be more easily extracted from the signal. In this regard, the receiver 120 includes a differential sense amplifier 122, a set of one or more differential decision feedback equalizer (DFE) taps TP1 to TPN, a comparator 124, and a DFE engine 126.

The differential sense amplifier 122 amplifies the receiver input differential signal D/$\overline{D}$ to generate an output differential signal Dint/$\overline{Dint}$, which is modified or waveform shaped by the set of one or more DFE taps TP1 to TPN. That is, the differential output of the sense amplifier 122 is coupled to differential inputs of the set of one or more DFE taps TP1 to TPN, which couples either the positive terminal (+) or the negative terminal (−) of the differential output of the sense amplifier 122 to ground based on tap signals T1 to TN generated by the DFE engine 126, respectively. As discussed further herein, the set of one or more taps TP1 to TPN causes the waveform of the output differential signal Dint/$\overline{Dint}$ of the sense amplifier 122 to be more square wave as compared to the differential signal D/$\overline{D}$ as the input of the receiver 120.

The differential output +/− of the sense amplifier 122 is coupled to differential input +/− of the comparator 124. The comparator 124 is configured to generate an output data Q based on the output differential signal Dint/$\overline{Dint}$. For example, if the output differential signal is positive (e.g., Dint−$\overline{Dint}$>0), then the comparator 124 generates the output data Q as a logic one (1). If the output differential signal is negative (e.g., Dint−$\overline{Dint}$<0), then the comparator 124 generates the output data Q as a logic zero (0).

The output of the comparator 124 is coupled to an input of the DFE engine 126. As discussed in more detail further herein, the DFE engine 126 may receive the outputs associated with other similarly-situated comparators 124 driven by similarly-situated sense amplifiers 122 and the other sets of one or more DFE taps TP1 and TPN. This is because these devices are driven by different phases of a clock (CLK) to sample the input differential signal D/$\overline{D}$ at different phases, respectively. The other similarly-situated comparators, sense amplifiers, and sets of DFE taps TP1 and TPN sample the input differential signal D/$\overline{D}$ at other phases to generate a set of output data Q1 to QM. The DFE engine 126 generates the set of tap signals T1 to TN based on the set of output data Q1 to QM.

Figure 1B:
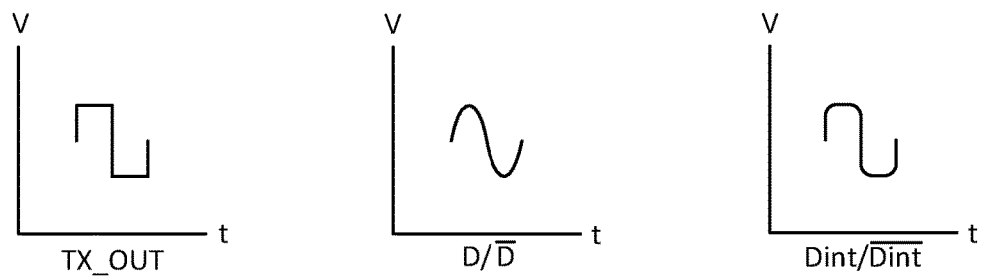
FIG. 1B illustrates graphs of example transmitter output signal waveform, receiver input signal waveform, and decision feedback equalizer (DFE) compensated signal waveform associated with the data communication system of FIG. 1A in accordance with another aspect of the disclosure.

FIG. 1B illustrates graphs of example transmitter output signal waveform, receiver input signal waveform, and decision feedback equalizer (DFE) compensated signal waveform associated with the data communication system 100 in accordance with another aspect of the disclosure. The x- or horizontal-axis of each of the graphs represents time (t). The y- or vertical-axis of each of the graphs represents voltage (V).

The left-graph illustrates the output differential signal TX_OUT waveform of the transmitter 110, which is substantially square wave (e.g., the transitions between different bits is more vertical). The middle-graph illustrates the differential signal D/$\overline{D}$ at the input of the receiver 120, which may be significantly more sinusoidal than the square wave of the output differential signal TX_OUT (e.g., the transitions between different bits is less vertical). The right-graph illustrates the output differential signal Dint/$\overline{Dint}$ of the sense amplifier 122 of the receiver 120, which has been modified by the set of one or more DFE taps TP1 to TPN controlled by DFE engine 126 via the tap signals T1 to TN, which is more square wave than the differential signal D/$\overline{D}$ at the input of the receiver 120. This allows the comparator 124 to more accurately generate the output data Q based on the receiver input differential signal D/$\overline{D}$.

Figures 2A, 2B:
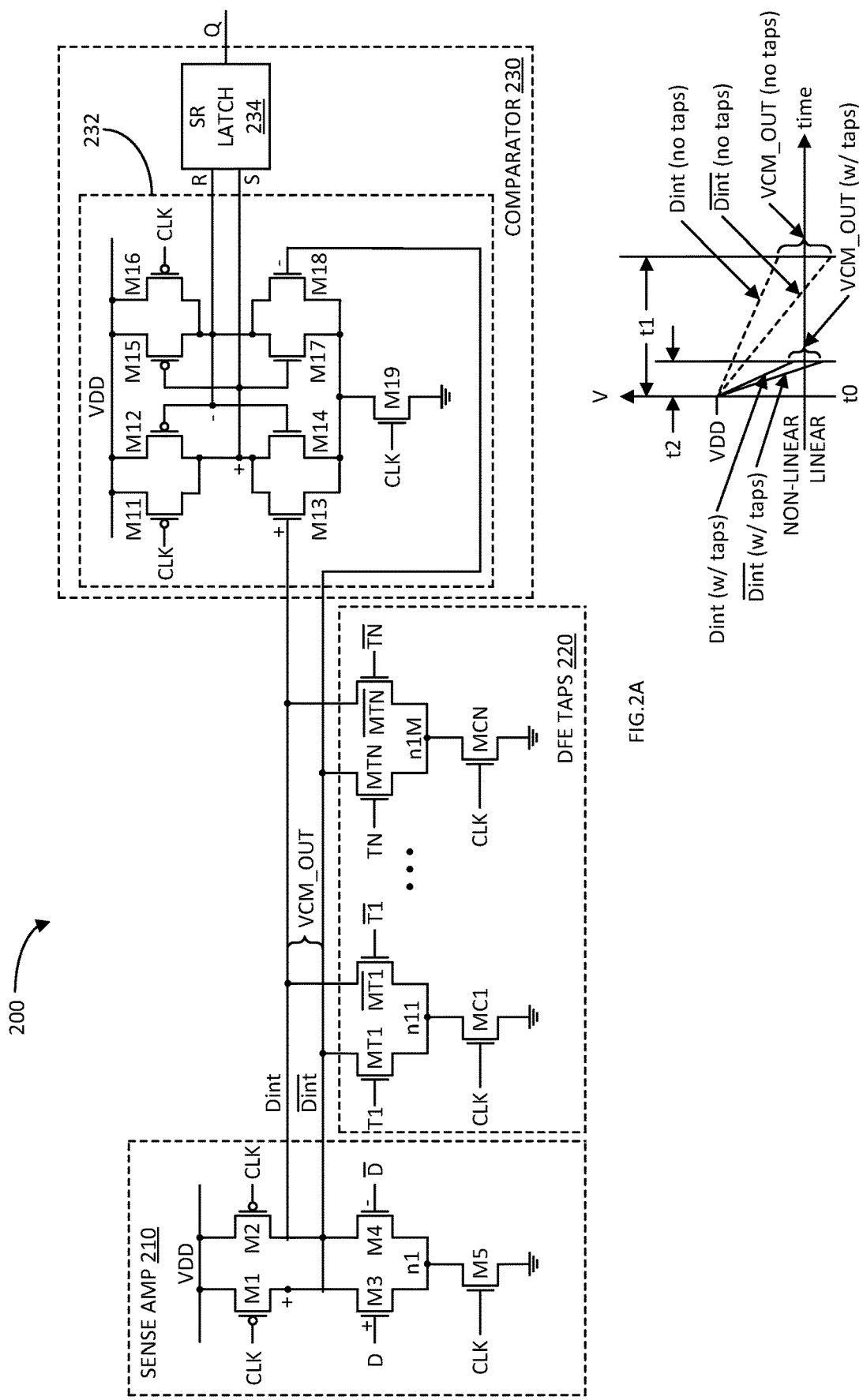
FIG. 2A illustrates a schematic diagram of an example differential data signal receiver in accordance with another aspect of the disclosure.
FIG. 2B illustrates a graph of example differential output voltages of a sense amplifier in the receiver of FIG. 2A with no DFE tap load and N DFE tap load in accordance with another aspect of the disclosure.

FIG. 2A illustrates a schematic diagram of an example differential data signal receiver 200 in accordance with another aspect of the disclosure. The receiver 200 may be an example more detailed implementation of the receiver 120 previously discussed. Similarly, the receiver 200 includes a differential sense amplifier 210, a set of one or more differential decision feedback equalizer (DFE) taps 220, and a comparator 230. With reference to receiver 120, the differential sense amplifier 210, the set of one or more differential decision feedback equalizer (DFE) taps 220, and the comparator 230 correspond to the differential sense amplifier 122, the set of one or more differential decision feedback equalizer (DFE) taps TP1 to TPN, and the comparator 124, respectively.

The differential sense amplifier 210 includes a pair of p-channel metal oxide semiconductor field effect transistors (PMOS FETs) M1 and M2, an input differential pair of n-channel metal oxide semiconductor field effect transistors (NMOS FETs) M3 and M4, and a tail NMOS FET M5. The PMOS FET M1 and NMOS FET M3 are coupled in series between a first (upper) voltage rail VDD and a node n1. Similarly, the PMOS FET M2 and NMOS FET M4 are coupled in series between the upper voltage rail VDD and the node n1. The tail NMOS FET M5 is coupled between the node n1 and a lower voltage rail (e.g., ground).

The PMOS FETs M1 and M2 include gates to receive a clock CLK. The tail NMOS FET M5 includes a gate to receive the clock CLK. The pair of input differential NMOS FETs M3 and M4 include gates to receive the input differential signal D/$\overline{D}$ of the receiver 200. The sense amplifier 210 is configured to amplify the input differential signal D/$\overline{D}$ to generate the output differential signal Dint/$\overline{Dint}$ at the drains of the pair of input differential NMOS FETs M3 and M4, respectively.

The set of differential DFE taps 220 include pairs of input differential NMOS FETs MT1/$\overline{MT1}$ to MTN/$\overline{MTN}$ coupled between the negative and positive sides of the differential output of the sense amplifier 210 and nodes n11 and n1M, respectively. The set of differential DFE taps 220 include tail NMOS FETs MC1 and MCN coupled between nodes n11 and N1M and ground, respectively. The pairs of input differential NMOS FETs MT1/$\overline{MT1}$ to MTN/$\overline{MTN}$ include gates configured to receive differential tap signals T1/$\overline{T1}$ to T1/TN generated by a DFE engine, respectively. The tail NMOS FETs MC1 to MCN include gates to receive the clock CLK.

The comparator 230 includes a differential latch 232 and a set-reset (SR) latch 234. The differential latch 232 includes a pair of input differential NMOS FETs M13 and M18 including gates coupled to the differential output of the sense amplifier 210. The differential latch 232 includes PMOS FETs M11 and M16 coupled between the upper voltage rail VDD and the drains of the input differential NMOS FETs M13 and M18, respectively. The PMOS FETs M11 and M16 include gates to receive the clock. The differential latch 232 further includes a tail NMOS FET M19 coupled between the pair of input differential NMOS FETs M13 and M18 and ground. The tail NMOS FET M19 includes a gate to receive the clock CLK.

The differential latch 232 further includes cross-coupled inverters. One of the cross-coupled inverters includes PMOS FET M12 could in series with NMOS FET M14 between the upper voltage rail VDD and the tail NMOS FET M19. The other cross-coupled inverter includes PMOS FET M15 could in series with NMOS FET M17 between the upper voltage rail VDD and the tail NMOS FET M19. The input (gates) of the first cross-coupled inverter M12/M14 is coupled to the drain of the input differential NMOS FET M18 and to the output (drains) of the second cross-coupled inverter M15/M17. And, the input (gates) of the second cross-coupled inverter M15/M17 is coupled to the drain of the input differential NMOS FET M13 and to the output (drains) of the first cross-coupled inverter M12/M14.

The differential latch 232 includes a differential output (+/−) coupled to the set/reset inputs of the SR latch 234. The differential latch 232 is configured to generate an output data Q. As previously discussed, the output data Q may be applied to a decision feedback equalizer (DFE) engine or may be applied to a clock and data recovery (CDR) circuit. As discussed further herein, there may be a set of M such receivers 200 coupled in parallel, with a common differential input to receive the input differential D/$\overline{D}$, and a set of M data outputs Q1 to QM, where some of the data outputs are coupled to the DFE engine to generate the tap signals T1/$\overline{T1}$ to T1/$\overline{TN}$ for the set of differential taps 220, and the other data outputs are coupled to the CDR circuit.

In operation, when the clock CLK is at a low state (e.g., ground), the sense amplifier 210, DFE taps 220, and comparator 230 are effectively disabled. More specifically, the sense amplifier 210 generates both Dint and $\overline{Dint}$ at high states (e.g., VDD) as PMOS FETs M1 and M2 are on, and the tail NMOS FET M5 is off. The set of differential DFE taps 220 are all off as their corresponding tail NMOS FETs MC1 to MCN are off (decouples both sides of the differential output of the sense amplifier 210 from ground). The differential latch 232 also generates both sides of its differential output (+/−) at high states (e.g., VDD) as PMOS FETs M11 and M16 are on, and tail NMOS FET M19 is off.

When the clock is at a high state (e.g., VDD), the sense amplifier 210, DFE taps 220, and comparator 230 are effectively enabled. That is, the sense amplifier 210 amplifies the input differential signal D/$\overline{D}$ to generate its output differential signal Dint/$\overline{Dint}$. The set of DFE taps 220 modifies the output differential signal Dint/$\overline{Dint}$ by shunting either terminal of the differential output of the sense amplifier 210 based on the differential tap signals T1/$\overline{T1}$ to TN/$\overline{TN}$ generated by a DFE engine. For example, if the tap signal T1/$\overline{T1}$ is high/low, then the input differential NMOS FETs FETs MT1/$\overline{MT1}$ are on/off, and the first differential tap shunts or grounds the negative terminal of the differential output of the sense amplifier 210. If the tap signal T1/$\overline{T1}$ is low/high, then the input differential NMOS FETs FETs MT1/$\overline{MT1}$ are off/on, and the first differential tap shunts or grounds the positive terminal of the differential output of the sense amplifier 210. The same applies for the one or more other differential taps of the set of DFE taps 220. As previously discussed, the DFE engine generates the differential tap signals T1/$\overline{T1}$ to TN/TN to shape the waveform of the output differential signal Dint/$\overline{Dint}$ to improve the latching of the data by the comparator 230.

The differential latch 232 of the comparator 230 latches the data in the output differential signal of the sense amplifier 210 based on the clock CLK. If at the rising edge of the clock CLK, Dint is greater than $\overline{Dint}$, the positive (+) and negative (−) output terminals of the differential latch 232 is at logic high and low, respectively. The positive (+) and negative (−) output terminals of the differential latch 232 being applied to the set and reset inputs of the SR latch 234 causes the SR latch to generate the output data Q as a logic one (1). If at the rising edge of the clock CLK, Dint is less than $\overline{Dint}$, the positive (+) and negative (−) output terminals of the differential latch 232 is at logic low and high, respectively. The positive (+) and negative (−) output terminals of the differential latch 232 being applied to the set and reset inputs of the SR latch 234 causes the SR latch to generate the output data Q as a logic one (0).

FIG. 2B illustrates a graph of an example output differential signal Dint/$\overline{Dint}$ of the sense amplifier 210 in accordance with another aspect of the disclosure. The x- or horizontal-axis of the graph represents time. The y- or vertical-axis of the graph represents the voltage (V).

The region above the x- or horizontal-axis is where an output common mode voltage VCM_OUT associated with the output differential signal Dint/$\overline{Dint}$ is in the non-linear region of the sense amplifier 210, where the sense amplifier 210 is generating sufficient gain to produce the output differential signal Dint/$\overline{Dint}$ at a level where the comparator 230 is able to accurately latch the data. The region below the x- or horizontal-axis is where the output common mode voltage VCM_OUT is in the linear region of the sense amplifier 210, where the differential gain of the sense amplifier is sufficiently low that the comparator 230 may not be able to accurately latch the data from the output differential signal Dint/$\overline{\text{Dint}}$.

If there are no taps coupled to the differential output of the sense amplifier 210, the output differential signal Dint/$\overline{\text{Dint}}$ (depicted as dashed lines) decreases from VDD at a time t0 (the beginning of the high state interval of the clock CLK) with a relatively small negative slope. The output common mode voltage VCM_OUT, which could also be represented as a negative slope line halfway between the Dint and $\overline{\text{Dint}}$ dashed lines, decreases from VDD to the linear region of the sense amplifier 210 within a time interval of t1. Thus, if the half-period of the clock CLK is less than the time interval t1, the output common mode voltage VCM_OUT remains in the non-linear region of the sense amplifier 210, where the sense amplifier 210 has sufficient gain to produce the output differential signal Dint/$\overline{\text{Dint}}$ at a level where the comparator 230 is able to accurately latch the data.

However, if the set of one or more differential DFE taps 220 are coupled to the differential output of the sense amplifier 210, the output differential signal Dint/$\overline{\text{Dint}}$ (depicted as solid lines) decreases from VDD at the time t0 with a relatively large negative slope. In this case, the output common mode voltage VCM_OUT, which could also be represented as a negative slope line halfway between the Dint and $\overline{\text{Dint}}$ solid lines, decreases from VDD to the linear region of the sense amplifier 210 within a time interval of t2, where t2 may be substantially equal to t1/N (where N is the number of taps). Thus, if the half-period of the clock CLK is greater than the time interval t2, the output common mode voltage VCM_OUT crosses into the linear region of the sense amplifier 210, where the sense amplifier 210 does not have sufficient gain to produce the output differential signal Dint/$\overline{\text{Dint}}$ at a level where the comparator 230 is able to accurately latch the data.

FIG. 3A illustrates a schematic diagram of an example output common mode voltage compensation circuit 300 in accordance with another aspect of the disclosure. In summary, the output common mode voltage compensation circuit 300 includes a reference receiver configured to generate a reference output common mode voltage VCM_REF that decreases from substantially VDD with a slope based on effectively no DFE, tap load at the differential output of a reference sense amplifier as discussed with reference to FIG. 2B; a replica receiver configured to generate a replica output common mode voltage VCM_REP that decreases from substantially VDD with a slope based on a set of one or more DFE taps at the differential output of a replica sense amplifier as discussed with reference to FIG. 2B; and a feedback circuit to adjust the replica output common mode voltage VCM_REP to be substantially the same as the reference output common mode voltage VCM_REF. The feedback circuit is also coupled to a data signal receiver to adjust its output common mode voltage to also be substantially the same as the reference output common mode voltage VCM_REF.

More specifically, the output common mode voltage compensation circuit 300 includes a reference receiver 335 including a reference differential sense amplifier (REF SA) 340 and a set of one or more reference (REF) differential DFE taps 350. The reference differential sense amplifier 340 includes a pair of PMOS FETs RF1 and RF2, an input differential pair of NMOS FETs RF3 and RF4, and a tail NMOS FET RF5. The PMOS FET RF1 and NMOS FET RF3 are coupled in series between a first (upper) voltage rail VDD and a node n2. Similarly, the PMOS FET RF2 and NMOS FET RF4 are coupled in series between the upper voltage rail VDD and the node n2. The tail NMOS FET RF5 is coupled between the node n2 and a second (lower) voltage rail (e.g., ground).

The PMOS FETs RF1 and RF2 include gates to receive a clock CLK. The tail NMOS FET RF5 includes a gate to receive the clock CLK. The pair of input differential NMOS FETs RF3 and RF4 include gates to receive a common mode voltage VCM associated an input differential signal D/$\overline{\text{D}}$ applied to one or more other data signal receivers, as discussed further herein. The reference differential sense amplifier 340 is configured to amplify the common mode voltage VCM to generate a reference common mode voltage VCM_REF at the differential output of the sense amplifier 340 with terminals coupled together. As illustrated, the terminals of the differential output of the sense amplifier 340 are coupled between the PMOS FET RF1/NMOS FET RF3 and PMOS FET RF2/NMOS FET RF4, respectively.

The set of one or more reference differential DFE taps 350 include pairs of input differential NMOS FETs TF1/$\overline{\text{TF1}}$ to TFN/$\overline{\text{TFN}}$ coupled between the negative and positive terminals of the differential output of the reference differential sense amplifier 340 and nodes n21 to n2M, respectively. The set of one or more reference differential DFB taps 350 include tail NMOS FETs CF1 and CFN coupled between nodes n21 to n2N and the lower voltage rail, respectively. The pairs of input differential NMOS FETs TF1/$\overline{\text{TF1}}$ to TFN/$\overline{\text{TFN}}$ include gates coupled to the lower voltage rail or ground, to turn off these devices so that substantially no tap load is presented to the differential output of the reference differential sense amplifier 340. The tail NMOS FETs CF1 to CFN include gates to receive the clock CLK.

The compensation circuit 300 includes a replica receiver 305 including a replica differential sense amplifier (REP SA) 310 and a set of one or more replica (REP) differential DFE taps 320. The replica differential sense amplifier 310 includes a pair of PMOS FETs RP1 and RP2, an input differential pair of NMOS FETs RP3 and RP4, and a tail NMOS FET RP5. The PMOS FET RP1 and NMOS FET RP3 are coupled in series between the upper voltage rail VDD and a node n1. Similarly, the PMOS FET RP2 and NMOS FET RP4 are coupled in series between the upper voltage rail VDD and the node n1. The tail NMOS FET RP5 is coupled between the node n1 and the lower voltage rail (e.g., ground).

The PMOS FETs RP1 and RP2 include gates to receive the clock CLK. The tail NMOS FET RP5 includes a gate to receive the clock CLK. The pair of input differential NMOS FETs RP3 and RP4 include gates to receive the common mode voltage VCM associated with the input differential signal D/$\overline{\text{D}}$. The replica differential sense amplifier 310 is configured to amplify the common mode voltage VCM to generate a replica common mode voltage VCM_REP at the differential output of the sense amplifier 310. As illustrated, the terminals of the differential output of the sense amplifier 310 are coupled between the PMOS FET RP1/NMOS FET RP3 and PMOS FET RP2/NMOS FET RP4, respectively.

The set of one or more replica differential DFE taps 320 include pairs of input differential NMOS FETs TR1/$\overline{\text{TR1}}$ to TRN/$\overline{\text{TRN}}$ coupled between the negative and positive terminals of the differential output of the replica differential sense amplifier 310 and nodes n11 to n1N, respectively. The set of one or more replica differential DFE, taps 320 further includes tail NMOS FETs TC1 and TCN coupled between nodes n11 to n1N and the lower voltage rail (e.g., ground), respectively. The pairs of input differential NMOS FETs TR1/$\overline{TR1}$ to TRN/$\overline{TRN}$ include gates to receive the common mode voltage VCM associated with the input differential signal D/$\overline{D}$, which is substantially the same as the common mode voltage of the differential tap signals T1/$\overline{T1}$ to TN/$\overline{TN}$ previously discussed. Thus, the set of one or more replica differential DFE taps 320 substantially replicates the tap load presented to the differential output of a sense amplifier of a data receiver. The tail NMOS FETs TC1 to TCN include gates to receive the clock CLK.

The compensation circuit 300 further includes a feedback circuit 360 including a comparator 330, an integrator 370, a set of current sources 380, and a pair of cascaded inverters 332 and 334. The comparator 330 includes positive and negative inputs coupled to the outputs of the reference and replica receivers 335 and 305, respectively. In this regard, the positive input of the comparator 330 is configured to receive the reference common mode voltage VCM_REF, and the negative input of the comparator 330 is configured to receive the replica common mode voltage VCM_REP. The comparator 330 is configured to generate a data output Q based on a comparison of the reference common mode voltage VCM_REF to the replica common mode voltage VCM_REP. The comparator 330 may be configured similar to comparator 230 previously discussed.

The output of the comparator 330 is coupled to an input of the integrator 370. The integrator 370 is configured to generate a current adjustment control signal (CUR_ADJ) by integrating the data output Q from the comparator 330. The integrator 370 includes an output, at which the CUR_ADJ control signal is generated, coupled to control inputs of current sources 382 and 384 of the set 380. The current sources 382 and 384 are coupled between the upper voltage rail VDD and the terminals of the differential output of the replica receiver 305, respectively. The cascaded inverters 332 and 334 operate as a delay element to receive the clock CLK to produce a delayed clock CLK_D. The delay element includes an output, at which the delayed clock CLK_D is produced, coupled to the clock inputs of the comparator 330 (e.g., gates of corresponding FETs M11, M16, and M19 as in comparator 230).

FIG. 3B illustrates a graph of example reference and replica output common mode voltages VCM_REF and VCM_REP of the compensation circuit 300 in accordance with another aspect of the disclosure. The x- or horizontal-axis of the graph represents time. The y- or vertical-axis of the graph represents the voltage (V). The time t0 indicated on the x- or horizontal-axis represents the rising edge of the clock CLK. The time t3 also indicated on the x- or horizontal-axis represents the rising edge of the delayed clock CLK_D.

The compensation circuit 300 operates as follows: The rising edge of the clock CLK at time t0 causes the reference receiver 335 (including the reference differential sense amplifier 340 and the set of one or more reference differential DFE taps 350) to generate the reference common mode voltage VCM_REF. Simultaneously, the rising edge of the clock CLK at time t0 also causes the replica receiver 305 (including the replica differential sense amplifier 310 and the set of one or more replica differential DFE, taps 320) to generate the replica common mode voltage VCM_REP. Both the reference and replica common mode voltage VCM_ REF and VCM_REP decrease with negative slopes from VDD at time t0. The reference common mode voltage VCM_REF negative slope profile is the target slope profile (e.g., the no tap load profile) for the replica common mode voltage VCM_REP. As discussed further herein, the feedback circuit 360 adjusts the replica common mode voltage VCM_REP such that it is substantially the same as the reference common mode voltage VCM_REF.

More specifically, consider the case where the replica common mode voltage VCM_REP$_1$ is decreasing with a negative slope greater than the negative slope of the reference common mode voltage VCM_REF. In such case, by the time t3 of the rising edge of the delayed clock CLK_D, the reference common mode voltage VCM_REF is greater than the replica common mode voltage VCM_REP$_1$. As the voltages VCM_REF and VCM_REP$_1$ are applied to the positive and negative inputs of the comparator 330, the comparator 330 generates the output data Q as a logic one (1). Thus, as long as the replica VCM_REP$_1$ is less than the reference VCM_REF for every subsequent clock cycle, the comparator 330 generates Q as successive logic ones (1s).

The integrator 370 integrates the logic ones (1s) to increase the current adjustment control signal CUR_ADJ. The increased current adjustment control signal CUR_ADJ causes the current sources 382 and 384 to apply more current to the differential output of the replica receiver 305 in order to increase VCM_REP until it is substantially the same as VCM_REF. At such time, the comparator 330 outputs Q as alternating ones (1s) and zero(s) due to the finite resolution of the comparator 330; thereby, causing the integrator 370 to generate a substantially constant current adjustment control signal CUR_ADJ to maintain VCM_REP substantially the same as VCM_REF.

Similarly, consider the case where the replica common mode voltage VCM_REP$_2$ is decreasing with a negative slope less than the negative slope of the reference common mode voltage VCM_REF. In such case, by the time t3 of the rising edge of the delayed clock CLK_D, the reference common mode voltage VCM_REF is less than the replica common mode voltage VCM_REP$_2$. As the voltages VCM_REF and VCM_REP$_2$ are applied to the positive and negative inputs of the comparator 330, the comparator 330 generates the output data Q as a logic zero (0). Thus, as long as the replica VCM_REP$_2$ is greater than the reference VCM_REF for every subsequent clock cycle, the comparator 330 generates Q as successive logic zeros (0s).

The integrator 370 integrates the logic zeros (0s) to decrease the current adjustment control signal CUR_ADJ. The decreased current adjustment control signal CUR_ADJ causes the current sources 382 and 384 to apply less current to the differential output of the replica receiver 305 in order to decrease VCM_REP until it is substantially the same as VCM_REF. At such time, the comparator 330 outputs Q as alternating ones (1s) and zero (0s); thereby, causing the integrator 370 to generate a substantially constant current adjustment control signal CUR_ADJ to maintain VCM_ REP substantially the same as VCM_REF.

As discussed further herein, the current adjustment control signal CUR_ADJ is also applied to corresponding similarly-situated current sources in one or more data receivers to control its/their output common mode voltage(s) such that it is substantially the same as the reference output common mode voltage VCM_REF.

FIG. 4A illustrates a schematic/block diagram of an example data receiver 400 including a set of one or more differential data signal receivers 405-1 to 405-M in accordance with another aspect of the disclosure. In this example, the set of differential data signal receivers 405-1 to 405-M are coupled in parallel; that is, all of their differential inputs are coupled together to receive the input differential signal D/$\overline{D}$. The set of differential data signal receivers 405-1 to 405-M may be clocked by a set of different-phase clocks CLK1 to CLKM, respectively. Based on the input differential signal D/$\overline{D}$ and the set of different-phase clocks CLK1 to CLKM, the set of differential data signal receivers 405-1 to 405-M are configured to generate a set of data outputs Q1 to QM, respectively. Some of the data outputs Q may be applied to a clock and data recovery (CDR) circuit to generate the clocks CLK1 to CLKM, and others may be applied to a DFE engine to generate the differential tap signals for the set of differential data signal receivers 405-1 to 405-M.

The set of differential data signal receivers 405-1 to 405-M may be configured substantially the same, with the differential data signal receiver 405-1 serving as an example for description purposes. The receiver 405-1 includes a differential sense amplifier 410-1, a set of one or more differential decision feedback equalizer (DFE) taps 420-1, a comparator 430-1, and a set of current sources 470-1.

The differential sense amplifier 410-1 includes a pair of PMOS FETs M1 and M2, an input differential pair of NMOS FETs M3 and M4, and a tail NMOS FET M5. The PMOS FET M1 and NMOS FET M3 are coupled in series between a first (upper) voltage rail VDD and a node n1. Similarly, the PMOS FET M2 and NMOS FET M4 are coupled in series between the upper voltage rail VDD and the node n1. The tail NMOS FET M5 is coupled between the node n1 and the second (lower) voltage rail (e.g., ground).

The PMOS FETs M1 and M2 include gates to receive the first-phase clock CLK1. The tail NMOS FET M5 includes a gate to receive the first-phase clock CLK1. The pair of input differential NMOS FETs M3 and M4 include gates to receive the input differential signal D/$\overline{D}$. The differential sense amplifier 410-1 is configured to amplify the input differential signal D/$\overline{D}$ to generate an output differential signal Dint/$\overline{Dint}$ at a differential output of the sense amplifier 410-1 (e.g., at the drains of the pair of input differential NMOS FETs M3 and M4, respectively).

The set of one or more differential DFE taps 420-1 include pairs of input differential NMOS FETs MT1/$\overline{MT1}$ to MTN/$\overline{MTN}$ coupled between the negative and positive sides of the differential output of the sense amplifier 410-1 and nodes n11 to n1N, respectively. The set of one or more differential DFE taps 420-1 further includes tail NMOS FETs MC1 and MCN coupled between the nodes n11 to n1N and the lower voltage rail (e.g., ground), respectively. The pairs of input differential NMOS FETs MT1/$\overline{MT1}$ to MTN/$\overline{MTN}$ include gates to receive differential taps signals T1/$\overline{T1}$ to T1/$\overline{TN}$ generated by a DFE engine, respectively. The tail NMOS FETs MC1 to MCN include gates to receive the first-phase clock CLK1.

The comparator 430-1 includes a differential input coupled to the differential output of the differential sense amplifier 410-1. The comparator 430-1 may be configured similar to comparator 230 previously discussed in detail, with the input clock being the first-phase clock CLK1. The comparator 430-1 is configured to generate the first data output Q1, which may be applied to the CDR circuit, the DFE engine, and/or other module.

The set of current sources 470-1 includes current sources 472 and 474 coupled between the upper voltage rail and the positive and negative terminals of the differential output of the sense amplifier 410-1. The current sources 472 and 474 include control inputs configured to receive the current adjustment control signal CUR_ADJ from the output common mode voltage compensation circuit 300 previously discussed. Accordingly, the current sources 472 and 474 supply currents to the positive and negative terminals of the differential output of the sense amplifier 410-1 based on the current adjustment control signal CUR_ADJ, such that the output common mode voltage VCM_OUT of the output differential signal Dint/$\overline{Dint}$ at the differential output of the sense amplifier 410-1 is regulated to be substantially the same as the reference common mode voltage VCM_REF of the compensation circuit 300. This ensures that the output common mode voltage VCM_OUT is maintained in the non-linear region of the sense amplifier 410-1 such that it has sufficient gain to generate the output differential signal Dint/$\overline{Dint}$ at a level where the comparator 430-1 is able to accurately extract the data Q1 from the signal.

FIG. 4B illustrates a schematic diagram of an example input common mode voltage source 480 in accordance with another aspect of the disclosure. The common mode voltage source 480 is configured to generate the common mode voltage VCM associated with the input differential signal D/$\overline{D}$. The common mode voltage source 480 includes two resistors R having substantially the same resistance (e.g., 32 kilo Ohms) coupled in series between the differential input of the set of differential data signal receivers 405-1 to 405-M. The common mode voltage VCM is generated at a node between the resistors R.

Figure 5:
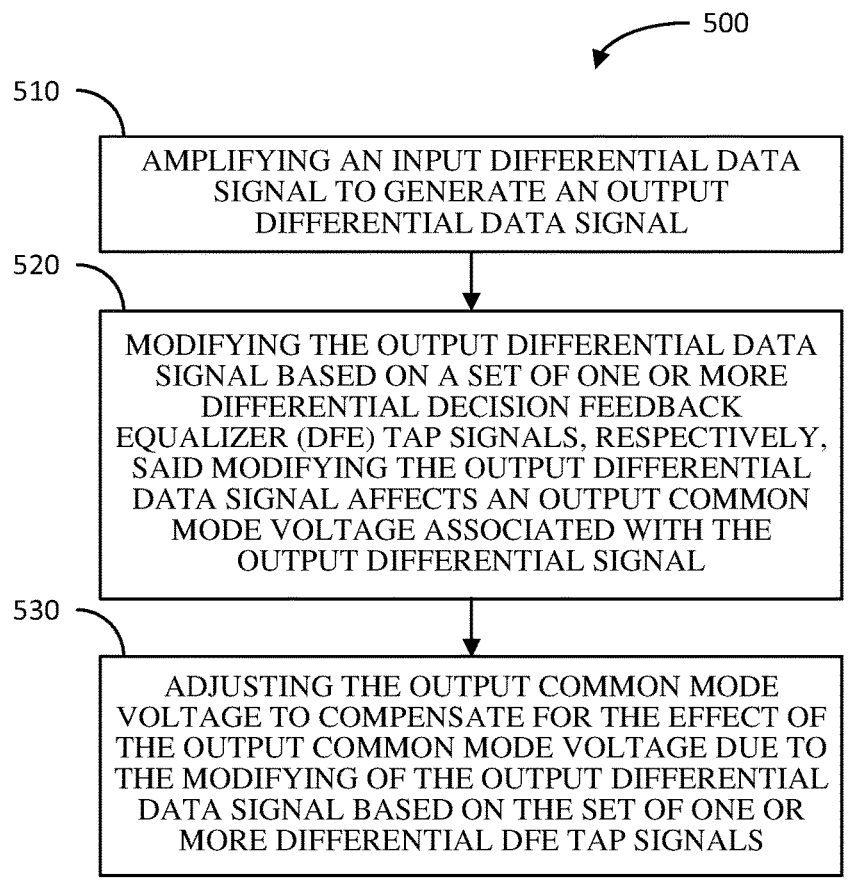
FIG. 5 illustrates a flow diagram of an example method of processing an input differential data signal in accordance with another aspect of the disclosure.

FIG. 5 illustrates a flow diagram of an exemplary method 500 of processing an input differential data signal in accordance with another aspect of the disclosure. The method 500 includes amplifying the input differential data signal to generate an output differential data signal (block 510). An example of a means for amplifying an input differential data signal to generate an output differential data signal includes any of the differential sensing amplifiers 410-1 to 410-M previously discussed.

The method 500 further includes modifying the output differential data signal based on a set of one or more differential decision feedback equalizer (DFE) tap signals, respectively, said modifying the output differential data signal affects an output common mode voltage associated with the output differential signal (block 520). An example of a means for modifying the output differential data signal based on a set of one or more differential decision feedback equalizer (DFE) tap signals, respectively, include any of the sets of one or more differential DFE taps 420-1 to 420-M previously discussed.

The method 500 further includes adjusting the output common mode voltage to compensate for the effect on the output common mode voltage due to the modifying of the output differential data signal based on the set of one or more differential DFE tap signals (block 530). An example of a means for adjusting the output common mode voltage to compensate for the effect on the output common mode voltage due to the modifying of the output differential data signal based on the set of one or more differential DFE tap signals include the output common mode voltage compensation circuit 300.

Figure 6:
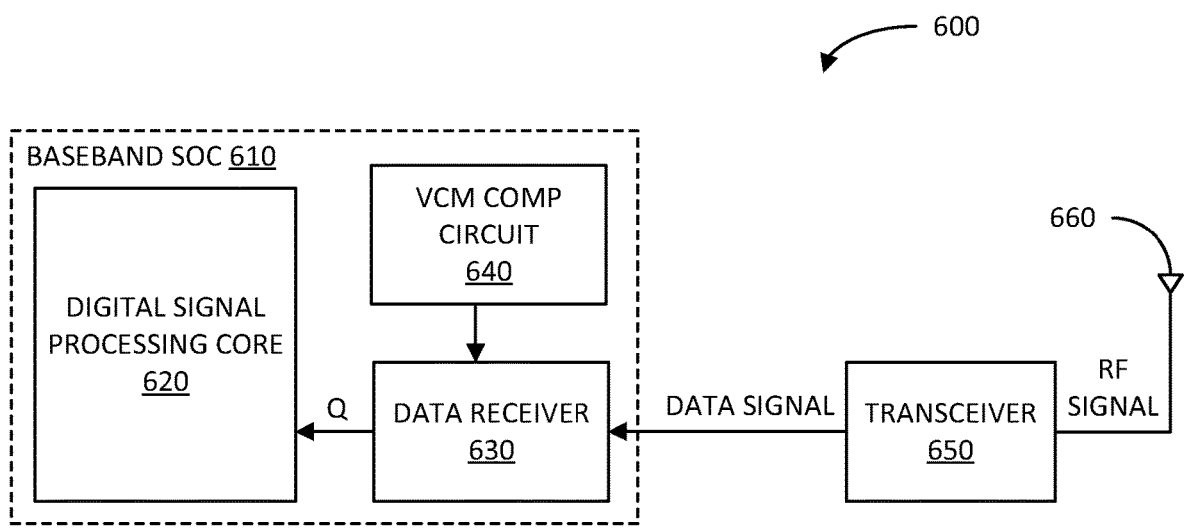
FIG. 6 illustrates a block diagram of an example wireless communication device in accordance with another aspect of the disclosure.

FIG. 6 illustrates a block diagram of an exemplary wireless communication device 600 in accordance with another aspect of the disclosure. The wireless communication device 600 may take a form factor of a smart phone, desktop computer, laptop computer, tablet devices, Internet of Things (IoT), and other types of computing devices.

The wireless communication device 600 includes a baseband integrated circuit (IC) or system on chip (SOC) 610, a transceiver 650, and at least one antenna 660. The baseband SOC 610 includes at least one digital signal processing core 620, a data receiver 630, and an output common mode voltage (VCM) compensation circuit 640. The data receiver 630 may be configured as per data receiver 400 previously discussed. The output VCM compensation circuit 640 may be configured as per compensation circuit 300 previously discussed.

The at least one antenna 660 is coupled to an input of the transceiver 650 to provide the latter a radio frequency (RF) signal wirelessly received from another wireless communication device. The transceiver 650 processes the RF signal to generate a differential data signal. The transceiver 650 includes a differential output coupled to a differential input of the data receiver 630 to provide the latter with the differential data signal. The data receiver 630 processes the differential data signal, as discussed with reference to data receiver 400, to generate output data Q for processing by the digital signal processing core 620.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a first receiver including a first differential input to receive a differential data signal and a first differential output;
   a second receiver including a second differential input to receive a common mode voltage associated with the differential data signal, and a second differential output including terminals coupled together;
   a third receiver including a third differential input to receive the common mode voltage, and a third differential output including terminals coupled together; and
   a feedback circuit including inputs coupled to the second and third differential outputs, respectively, and an output coupled to the first and second differential outputs.

2. The apparatus of claim 1, wherein the second receiver comprises a differential sense amplifier coupled to the second differential input and the second differential output.

3. The apparatus of claim 2, wherein the differential sense amplifier comprises:
   first and second field effect transistors (FETs) coupled in series between a first voltage rail and a node, wherein the first FET includes a gate to receive a clock, wherein the second FET includes a gate coupled to a first terminal of the second differential input, and wherein the second differential output is coupled between the first and second FETs;
   third and fourth FETs coupled in series between the first voltage rail and the node, wherein the third FET includes a gate to receive the clock, wherein the fourth FET includes a gate coupled to a second terminal of the second differential input, and wherein the second differential output is coupled between the third and fourth FETs; and
   a fifth FET coupled between the node and a second voltage rail.

4. The apparatus of claim 3, wherein:
   each of the first and third FETs comprises a p-channel metal oxide semiconductor field effect transistor (PMOS FET); and
   each of the second, fourth, and fifth FETs comprises an n-channel metal oxide semiconductor field effect transistor (NMOS FET).

5. The apparatus of claim 1, wherein the second receiver comprises a set of one or more differential decision feedback equalizer (DFE) taps coupled between the second differential output and a voltage rail, wherein the set of one or more differential DFB taps include a set of one or more differential inputs to receive the common mode voltage.

6. The apparatus of claim 5, wherein each of the set of one or more differential DFE taps comprises:
   a first field effect transistor (FET) coupled between the second differential output and a node, wherein the first FET includes a gate to receive the common mode voltage;
   a second FET coupled between the second differential output and the node, wherein the second FET includes a gate to receive the common mode voltage; and
   a third FET coupled between the node and the voltage rail, wherein the third FET includes a gate to receive a clock.

7. The apparatus of claim 6, wherein each of the first, second, and third FETs comprises an n-channel metal oxide semiconductor field effect transistor (NMOS FET).

8. The apparatus of claim 1, wherein the third receiver comprises a differential sense amplifier coupled to the third differential input and the third differential output.

9. The apparatus of claim 8, wherein the differential sense amplifier comprises:
   first and second field effect transistors (FETs) coupled in series between a first voltage rail and a node, wherein the first FET includes a gate to receive a clock, wherein the second FET includes a gate to receive the common mode voltage, and wherein the third differential output is coupled between the first and second FETs;
   third and fourth FETs coupled in series between the first voltage rail and the node, wherein the third FET includes a gate to receive the clock, wherein the fourth FET includes a gate to receive the common mode voltage, and wherein the third differential output is coupled between the third and fourth FETs; and
   a fifth FET coupled between the node and a second voltage rail.

10. The apparatus of claim 9, wherein:
    each of the first and third FETs comprises a p-channel metal oxide semiconductor field effect transistor (PMOS FET); and
    each of the second, fourth, and fifth FETs comprises an n-channel metal oxide semiconductor field effect transistor (NMOS FET).

11. The apparatus of claim 1, wherein the third receiver comprises a set of one or more differential decision feedback equalizer (DFE) taps coupled between the third differential output and a voltage rail, wherein the set of one or more differential DFE taps include a set of one or more differential inputs coupled to a voltage rail.

12. The apparatus of claim 11, wherein each of the set of one or more differential DFE taps comprises:
    a first field effect transistor (FET) coupled between the third differential output and a node, wherein the first FET includes a gate coupled to the voltage rail;
    a second FET coupled between the third differential output and the node, wherein the second FET includes a gate coupled to the voltage rail; and
    a third FET coupled between the node and the voltage rail, wherein the third FET includes a gate to receive a clock.

13. The apparatus of claim 12, wherein each of the first, second, and third FETs comprises an n-channel metal oxide semiconductor field effect transistor (NMOS FET).

14. The apparatus of claim 1, wherein the feedback circuit comprises:
   a comparator including the inputs coupled to the second and third differential outputs, respectively;
   an integrator including an input coupled to an output of the comparator; and
   a first current source coupled between a voltage rail and the second differential output, wherein the first current source includes a first control input coupled to an output of the integrator; and
   a second current source coupled between the voltage rail and the second differential output, wherein the second current source includes a second control input coupled to the output of the integrator.

15. The apparatus of claim 14, wherein the first receiver comprises:
   a third current source coupled between the voltage rail and a first terminal of the first differential output, wherein the third current source includes a third control input coupled to the output of the integrator; and
   a fourth current source coupled between the voltage rail and a second terminal of the first differential output, wherein the fourth current source includes a fourth control input coupled to the output of the integrator.

16. The apparatus of claim 14, wherein the feedback circuit further comprises a delay element including an input to receive the clock, and an output coupled to the comparator.

17. The apparatus of claim 14, wherein the comparator comprises:
   a differential latch including the inputs coupled to the second and third differential outputs, respectively, and a differential output including first and second terminals; and
   a set-reset (SR) latch including set and reset inputs coupled to the first and second terminals of the differential output of the differential latch, and an output coupled to the input of the integrator.

18. An apparatus, comprising:
   a first differential sense amplifier configured to amplify an input differential data signal to generate an output differential data signal;
   a first set of one or more differential decision feedback equalizer (DFE) taps configured to modify the output differential data signal based on a set of one or more differential tap signals, wherein the first set of one or more differential DFE taps affect a first output common mode voltage associated with the output differential data signal; and
   a compensation circuit configured to adjusts the first output common mode voltage to compensate for the effect on the first output common mode voltage by the first set of one or more differential DFE taps.

19. The apparatus of claim 18, wherein the compensation circuit comprises:
   a second differential sense amplifier configured to amplify an input common mode voltage associated with the input differential data signal to generate a second output common mode voltage;
   a second set of one or more differential DFE taps configured to modify the second output differential data signal based on the input common mode voltage;
   a third differential sense amplifier configured to amplify the input common mode voltage to generate a third output common mode voltage;
   a fourth set of one or more disabled differential DFE taps coupled to a differential output of the third differential sense amplifier, wherein the third common output mode voltage is generated at the differential output; and
   a feedback circuit configured to adjust the first output common mode voltage based on the second and third output common mode voltages.

20. The apparatus of claim 19, wherein the feedback circuit comprises:
   a comparator configured to generate data based on the second and third output common mode voltages;
   an integrator configured to integrate the data to generate a control signal; and
   a first set of one or more current sources configured to supply current to a differential output of the second differential sense amplifier to adjust the second output common mode voltage based on the control signal.

21. The apparatus of claim 20, further comprising a second set of one or more current sources configured to supply current to a differential output of the first differential sense amplifier to effectuate the adjustment of the first output common mode voltage.

22. The apparatus of claim 21, wherein:
   the first set of one or more current sources comprise a first pair of current sources coupled between a voltage rail and the differential output of the second differential sense amplifier; and
   the second set of one or more current sources comprise a second pair of current sources coupled between the voltage rail and first and second terminals of the differential output of the first differential sense amplifier, respectively.

23. A method, comprising:
   amplifying an input differential data signal to generate an output differential data signal;
   modifying the output differential data signal based on a set of one or more differential decision feedback equalizer (DFE) tap signals, said modifying the output differential data signal affects a first output common mode voltage associated with the output differential signal; and
   adjusting the first output common mode voltage to compensate for the effect on the first output common mode voltage due to the modifying of the output differential data signal based on the set of one or more differential DFE tap signals.

24. The method of claim 23, wherein adjusting the first output common mode voltage comprises:
   amplifying an input common mode voltage associated with the input differential data signal to generate a second output common mode voltage;
   modifying the second output common mode voltage based on the input common mode voltage;
   amplifying the input common mode voltage to generate a third output common mode voltage;
   coupling a set of one or more disabled differential taps load to a differential output of the third differential sense amplifier, wherein the third common output mode voltage is generated at the differential output; and
   adjusting the first output common mode voltage based on the second and third output common mode voltages.

25. The method of claim 24, wherein adjusting the first output common mode voltages, comprises:
   generating data based on a comparison of the second output common mode voltage to the third output common mode voltage;

integrating the data to generate a control signal;
supplying current to a differential output of the second differential sense amplifier to adjust the second output common mode voltage based on the control signal; and
supplying current to the differential output of the first differential sense amplifier to adjust the first output common mode voltage based on the control signal.

26. A wireless communication device, comprising:
at least one antenna;
a transceiver coupled to the at least one antenna; and
a first receiver including a first differential input coupled to the transceiver, and a first differential output;
a second receiver including a second differential input to receive a common mode voltage associated with a differential data signal at the first differential input, and a second differential output including terminals coupled together;
a third receiver including a third differential input to receive common mode voltage, and a third differential output including terminals coupled together; and
a feedback circuit including inputs coupled to the second and third differential outputs, respectively, and an output coupled to the first and second differential outputs.

27. The wireless communication device of claim 26, wherein:
the second receiver comprises:
a first differential sense amplifier coupled to the second differential input and the second differential output; and
a first set of one or more differential decision feedback equalizer (DFE) taps coupled between the second differential output and a voltage rail, wherein the first set of one or more differential DFE taps include a set of one or more differential inputs to receive the common mode voltage;
the third receiver comprises:
a second differential sense amplifier coupled to the third differential input and the third differential output; and
a second set of one or more differential DFE taps coupled between the third differential output and the voltage rail, wherein the set of one or more differential DFE taps include a set of one or more differential inputs coupled to the voltage rail.

\* \* \* \* \*

UNITED STATES PATENT AND TRADEMARK OFFICE
CERTIFICATE OF CORRECTION

| | |
|---|---|
| PATENT NO. | : 11,349,445 B2 |
| APPLICATION NO. | : 17/017239 |
| DATED | : May 31, 2022 |
| INVENTOR(S) | : Ying Duan et al. |

It is certified that error appears in the above-identified patent and that said Letters Patent is hereby corrected as shown below:

In the Specification

Column 6, Line 55: the term "logic one (0)" is replaced with "logic zero (0)".

Column 8, Line 25: the term "nodes n21 to n2M" is replaced with "nodes n21 to n2N".

Signed and Sealed this
Twenty-eighth Day of March, 2023

Katherine Kelly Vidal
*Director of the United States Patent and Trademark Office*